United States Patent
Yun et al.

(10) Patent No.: US 7,755,405 B2
(45) Date of Patent: Jul. 13, 2010

(54) DLL CIRCUIT AND METHOD OF CONTROLLING THE SAME

(75) Inventors: Won-Joo Yun, Ichon (KR); Hyun-Woo Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/172,137

(22) Filed: Jul. 11, 2008

(65) Prior Publication Data

US 2009/0146708 A1 Jun. 11, 2009

(30) Foreign Application Priority Data

Dec. 10, 2007 (KR) ...................... 10-2007-0127482

(51) Int. Cl.
*H03L 7/06* (2006.01)

(52) U.S. Cl. .................. 327/158; 327/156; 327/157; 327/172; 331/18; 331/19; 331/25; 331/34; 375/373; 375/376

(58) Field of Classification Search ......... 327/156–158, 327/172; 331/18–19, 25, 34; 375/373–376
See application file for complete search history.

(56) References Cited

U.S. PATENT DOCUMENTS

| | | | |
|---|---|---|---|
| 6,483,359 B2 | 11/2002 | Lee | |
| 6,680,635 B2 * | 1/2004 | Lee | ............................ 327/158 |
| 6,822,494 B2 | 11/2004 | Kim | |
| 6,853,226 B2 | 2/2005 | Kwak et al. | |
| 6,943,602 B1 | 9/2005 | Lee | |
| 7,372,311 B2 | 5/2008 | Kang | |
| 7,598,783 B2 * | 10/2009 | Shin et al. | .................... 327/158 |
| 2007/0152723 A1 | 7/2007 | Ahn et al. | |
| 2008/0164920 A1 * | 7/2008 | Cho | ........................... 327/158 |

FOREIGN PATENT DOCUMENTS

| | | |
|---|---|---|
| JP | 2005-020686 | 1/2005 |
| KR | 1020030090122 | 11/2003 |
| KR | 1020060000866 | 1/2006 |
| KR | 1020070027787 | 3/2007 |
| KR | 100837822 | 6/2008 |

* cited by examiner

*Primary Examiner*—Lincoln Donovan
*Assistant Examiner*—Shikha Goyal
(74) *Attorney, Agent, or Firm*—Baker & McKenzie LLP (57) ABSTRACT

A delay locked loop (DLL) circuit includes a first delay control unit configured to generate a first delay control signal in response to a first phase detection signal to control a delay amount of a first delay line and to output a first delay amount information signal, a second delay control unit configured to generate a second delay control signal in response to a second phase detection signal to control a delay amount of a second delay line and to output a second delay amount information signal, and to control the delay amount of the second delay line again in response to the first delay control signal and a half cycle information signal, a half cycle detecting unit configured to receive the first delay amount information signal and the second delay amount information signal to extract half cycle information of a reference clock signal, thereby generating the half cycle information signal, and a duty cycle correcting unit configured to combine an output clock signal from the first delay line and an output clock signal from the second delay line, thereby outputting a duty ratio correction clock signal.

28 Claims, 8 Drawing Sheets

DLL CIRCUIT AND METHOD OF CONTROLLING THE SAME

CROSS-REFERENCE TO RELATED PATENT APPLICATION

This application claims the benefit under 35 U.S.C 119(a) of Korean Application No. 10-2007-0127482, filed on Dec. 10, 2007, in the Korean Intellectual Property Office, the disclosure of which is incorporated herein in its entirety by reference as if set forth in full.

BACKGROUND

1. Technical Field

The embodiments described herein relate to a delay locked loop (DLL) circuit and a method of controlling the same, and more particularly, to a DLL circuit that generates an internal clock signal whose phase is more advanced than a phase of an external clock signal and a method of controlling the same.

2. Related Art

In general, a DLL circuit is used to provide an internal clock signal whose phase is more advanced than a phase of a reference clock signal obtained by converting an external clock signal by a predetermined time. The DLL circuit is also used to resolve the following problem. If an internal clock signal used in a semiconductor integrated circuit is delayed by a clock buffer and a transmission line, a phase difference is generated between the internal clock signal and an external clock signal, which results in an increase in the output data access time. As a result, in order to increase an effective data output period, a conventional DLL circuit performs a control operation such that a phase of the internal clock signal is more advanced than a phase of the external clock signal by a predetermined time.

A duty ratio of an output clock signal from a DLL circuit should be maintained at a predetermined ratio (for example, 50:50) in order to prevent the operational efficiency of a DLL circuit from deteriorating. However, the duty ratio of the output clock signal from a conventional DLL circuit may easily vary due to jitters outside the DLL circuit and irregular delay values of delay elements inside the DLL circuit. In order to prevent the duty ratio from varying, a conventional DLL circuit includes a duty cycle correction device to maintain a duty ratio of an output clock signal at a predetermined ratio.

However, the duty cycle correction apparatus that is included in a conventional DLL circuit occupies a large area and has a long operation time. Further, the operational characteristic of a conventional DLL circuit often deteriorate when operating at low power. Due to the high-speed operation, high integration, and low power consumption of today's semiconductor integrated circuits, it necessary to provide such circuits with a clock signal having an accurate duty ratio, something conventional DLL circuits cannot always do.

SUMMARY

A DLL circuit that is capable of generating a clock signal having an improved duty ratio characteristic and a method of controlling the same are described herein.

According to one aspect, there is provided a delay locked loop (DLL) circuit of a dual loop type. The DLL circuit includes a first delay control unit configured to generate a first delay control signal in response to a first phase detection signal to control a delay amount of a first delay line and to output a first delay amount information signal, a second delay control unit configured to generate a second delay control signal in response to a second phase detection signal to control a delay amount of a second delay line and to output a second delay amount information signal, and to control the delay amount of the second delay line again in response to the first delay control signal and a half cycle information signal, a half cycle detecting unit configured to receive the first delay amount information signal and the second delay amount information signal to extract half cycle information of a reference clock signal, thereby generating the half cycle information signal, and a duty cycle correcting unit configured to combine an output clock signal from the first delay line and an output clock signal from the second delay line, thereby outputting a duty ratio correction clock signal.

According to another aspect, there is provided a delay locked loop (DLL) circuit of a dual loop type. The DLL circuit includes a delay control unit configured to generate a first delay control signal in response to a first phase detection signal and to generate a second delay control signal that defines a delay amount, which is obtained by summing a delay amount defined by the first delay control signal and a delay amount corresponding to a half cycle of a reference clock signal, a first delay line configured to delay the reference clock signal in response to the first delay control signal, thereby generating a first delay clock signal, a second delay line configured to delay the reference clock signal in response to the second delay control signal, thereby generating a second delay clock signal, and a duty cycle correcting unit configured to combine the first delay clock signal and the second delay clock signal, thereby generating a duty ratio correction clock signal.

According to still another aspect, a delay locked loop (DLL) circuit includes a first feedback loop configured to delay a reference clock signal by a first delay amount to generate a first delay clock signal, a second feedback loop configured to delay the reference clock signal by a second delay amount to generate a second delay clock signal, and to delay the reference clock signal in response to delay amount information for the first delay clock signal and a half cycle information signal, thereby regenerating the second delay clock signal, a half cycle detecting unit configured to use information for the first delay amount and information for the second delay amount to extract half cycle information of the reference clock signal, thereby generating the half cycle information signal, and a duty cycle correcting unit configured to combine the first delay clock signal and the second delay clock signal, thereby generating a duty ratio correction clock signal.

According to still another aspect, there is provided a method of controlling a delay locked loop (DLL) circuit having a dual loop type. The method includes controlling delay amounts of a first delay line and a second delay line in response to a first phase detection signal and a second phase detection signal; extracting half cycle information of a reference clock signal on the basis of delay amount information of the first delay line and delay amount information of the second delay line, controlling the delay amount of the second delay line again in response to the half cycle information and the delay amount information of the first delay line, and combining a clock signal output from the first delay line and a clock signal output from the second delay line, thereby generating a duty ratio correction clock signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
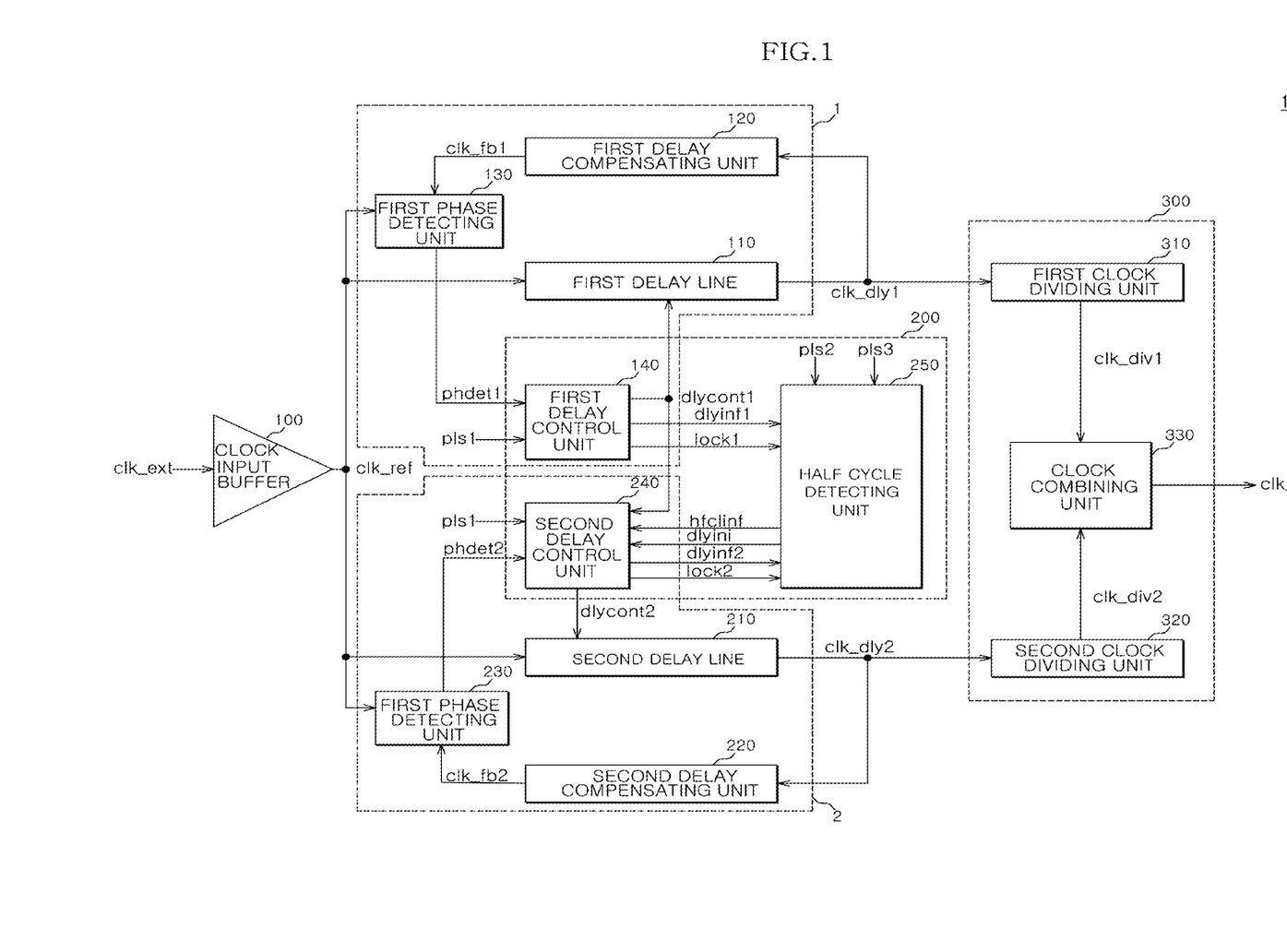
FIG. 1 is a block diagram illustrating a structure of a DLL circuit according to one embodiment.

FIG. 1 is a diagram illustrating a DLL circuit 101 configured in accordance with one embodiment. Referring to FIG. 1, the DLL circuit 101 can include a clock input buffer 100, a first delay line 110, a first delay compensating unit 120, a first phase detecting unit 130, a first delay control unit 140, a second delay line 210, a second delay compensating unit 220, a second phase detecting unit 230, a second delay control unit 240, a half cycle detecting unit 250, a first clock dividing unit 310, a second clock dividing unit 320, and a clock combining unit 330.

The clock input buffer 100 can be configured to buffer an external clock signal 'clk_ext' and to generate a reference clock signal 'clk_ref'. The first delay line 110 can be configured to delay the reference clock signal 'clk_ref' in response to a first delay control signal 'dlycont1' and to generate a first delay clock signal 'clk_dly1'. The first delay compensating unit 120 can be configured to apply a delay time, which is obtained by simulating a delay amount of delay elements on an output path of the first delay clock signal 'clk_dly1', to the first delay clock signal 'clk_dly1', and to generate a first feedback clock signal 'clk_fb1'.

The first phase detecting unit 130 can be configured to detect and compare phases of the reference clock signal 'clk_ref' and the first feedback clock signal 'clk_fb1' and to generate a first phase detection signal 'phdet1'. The first delay control unit 140 can be configured to generate the first delay control signal 'dlycont1', a first delay amount information signal 'dlyinf1', and a first locking signal 'lock1' in response to a first pulse signal 'pls1' and the first phase detection signal 'phdet1'.

The second delay line 210 can be configured to delay the reference clock signal 'clk_ref' in response to a second delay control signal 'dlycont2' and to generate a second delay clock signal 'clk_dly2'. The second delay compensating unit 220 can be configured to apply a delay time, which is obtained by simulating a delay amount of delay elements on an output path of the second delay clock signal 'clk_dly2', to the second delay clock signal 'clk_dly2', and to generate a second feedback clock signal 'clk_fb2'. The second phase detecting unit 230 can be configured to detect and compare phases of the reference clock signal 'clk_ref' and the second feedback clock signal 'clk_fb2' and to generate a second phase detection signal 'phdet2'. The second delay control unit 240 can be configured to generate the second delay control signal 'dlycont2', a second delay amount information signal 'dlyinf2', and a second locking signal 'lock2' in response to the first pulse signal 'pls1', the second phase detection signal 'phdet2', the first delay control signal 'dlycont1', a half cycle information signal 'hfclinf', and a delay initialization signal 'dlyini'.

The half cycle detecting unit 250 can be configured to generate the delay initialization signal 'dlyini' and the half cycle information signal 'hfclinf' in response to a second pulse signal 'pls2', a third pulse signal 'pls3', the first locking signal 'lock1', the second locking signal 'lock2', the first delay amount information signal 'dlyinf1', and the second delay amount information signal 'dlyinf2'.

The first clock dividing unit 310 can be configured to divide a frequency of the first delay clock signal 'clk_dly1' with a predetermined division ratio and to generate a first division clock signal 'clk_div1'. The second clock dividing unit 320 can be configured to divide a frequency of the second delay clock signal 'clk_dly2' with the predetermined division ratio and to generate a second division clock signal 'clk_div2'. The clock combining unit 330 can be configured to combine the first division clock signal 'clk_div1' and the second division clock signal 'clk_div2' and to generate a duty ratio correction clock signal 'clk_crt'.

As such, the DLL circuit 101 has a dual loop type including a first feedback loop 1 and a second feedback loop 2. The first feedback loop 1 includes the first delay line 110, the first delay compensating unit 120, the first phase detecting unit 130, and the first delay control unit 140. The second feedback loop 2 includes the second delay line 210, the second delay compensating unit 220, the second phase detecting unit 230, and the second delay control unit 240.

The first feedback loop 1 can be configured to delay the reference clock signal 'clk_ref' by a first delay amount and to generate the first delay clock signal 'clk_dly1'. The second feedback loop 2 can be configured to delay the reference clock signal 'clk_ref' by a second delay amount and to generate the second delay clock signal 'clk_dly2'. The second feedback loop 2 can delay the reference clock signal 'clk_ref' in response to delay amount information of the first delay clock signal 'clk_dly1' and the half cycle information signal 'hfclinf' and to regenerate the second delay clock signal 'clk_dly2'.

The first delay control unit 140, the second delay control unit 240, and the half cycle detecting unit 250 can be referred to as a delay control unit 200 because they control the delay amounts of the first delay line 110 and the second delay line 210. That is, the delay control unit 200 can be configured to generate the first delay control signal 'dlycont1' in response to the first phase detection signal 'phdet1'. Then, the delay control unit 200 can be configured to generate the second delay control signal 'dlycont2' that defines a delay amount, which is obtained by adding the delay amount defined by the first delay control signal 'dlycont1' to a delay amount corresponding to a half cycle of the reference clock signal 'clk_ref'.

The first clock dividing unit 310, the second clock dividing unit 320, and the clock combining unit 330 can be referred to as a duty cycle correcting unit 300 because they combine the first delay clock signal 'clk_dly1' and the second delay clock signal 'clk_dly2' and generate the duty ratio correction clock signal 'clk_crt'.

Each of the first pulse signal 'pls1', the second pulse signal 'pls2', and the third pulse signal 'pls3' (not shown) can be generated from a general clock generator. Each of the first pulse signal 'pls1', the second pulse signal 'pls2', and the third pulse signal 'pls3' can be enabled once for every predetermined set of cycles (for example, 20 cycles) of the reference clock signal 'clk_ref', and can have an enable period that corresponds to one cycle of the reference clock signal 'clk_ref'. In this example, it is assumed that the first pulse signal 'pls1' has an enable period earlier than that of the second pulse signal 'pls2' and the second pulse signal 'pls2' has an enable period earlier than that of the third pulse signal 'pls3'.

The first delay control signal 'dlycont1' and the second delay control signal 'dlycont2' can each be implemented as m bits of a digital code signal. The first delay amount information signal 'dlyinf1', the second delay amount information signal 'dlyinf2', and the half cycle information signal 'hfclinf' can each be implemented as n bits of a digital code signal.

The operation of the DLL circuit that has the above-described structure will be described in detail with reference to the timing chart shown in FIG. 2. In this example, a high-level period of the reference clock signal 'clk_ref' is longer than a low-level period thereof.

First, the first delay control unit 140 can generate the first delay control signal 'dlycont1' in response to the first phase detection signal 'phdet1', thereby controlling a delay amount of the first delay line 110. The first delay control signal 'dlycont1' can initially be set to have an arbitrary code value, and a logical value of the first delay control signal can be varied whenever the first pulse signal 'pls1' is enabled. The first delay control unit 140 can extract delay amount information of the first delay line 110 on the basis of a variation in the logical value of the first delay control signal 'dlycont1' and output the first delay amount information signal 'dlyinf1' including the extracted delay amount information.

If a primary locking operation is completed, then the first delay control unit 140 can enable the first locking signal 'lock1'. At this time, in order to synchronize the first feedback clock signal 'clk_fb1' and the reference clock signal 'clk_ref' with each other, the first delay line 110 can apply a positive delay time to the reference clock signal 'clk_ref' and generate the first delay clock signal 'clk_dly1'.

Similar to the first delay control unit 140, the second delay control unit 240 can generate the second delay control signal 'dlycont2' in response to the second phase detection signal 'phdet2', thereby controlling a delay amount of the second delay line 210. The second delay control signal 'dlycont2' can initially be set to have an arbitrary code value, and a logical value of the second delay control signal can be varied whenever the first pulse signal 'pls1' is enabled. The second delay control unit 240 can extract delay amount information of the second delay line 210 on the basis of a variation in the logical value of the second delay control signal 'dlycont2' and output the second delay amount information signal 'dlyinf2' including the extracted delay amount information.

If a primary locking operation is completed, then the second delay control unit 240 can enable the second locking signal 'lock2'. At this time, in order to synchronize the second feedback clock signal 'clk_fb2' and the reference clock signal 'clk_ref' with each other, the second delay line 210 can apply a negative delay time to the reference clock signal 'clk_ref' and generate the second delay clock signal 'clk_dly2'.

If the first locking signal 'lock1' and the second locking signal 'lock2' are enabled, then the half cycle detecting unit 250 can extract a half cycle of the reference clock signal 'clk_ref' on the basis of the delay time applied to the reference clock signal 'clk_ref' by the first delay line 110 and the delay time applied to the reference clock signal 'clk_ref' by the second delay line 210.

Figure 2:
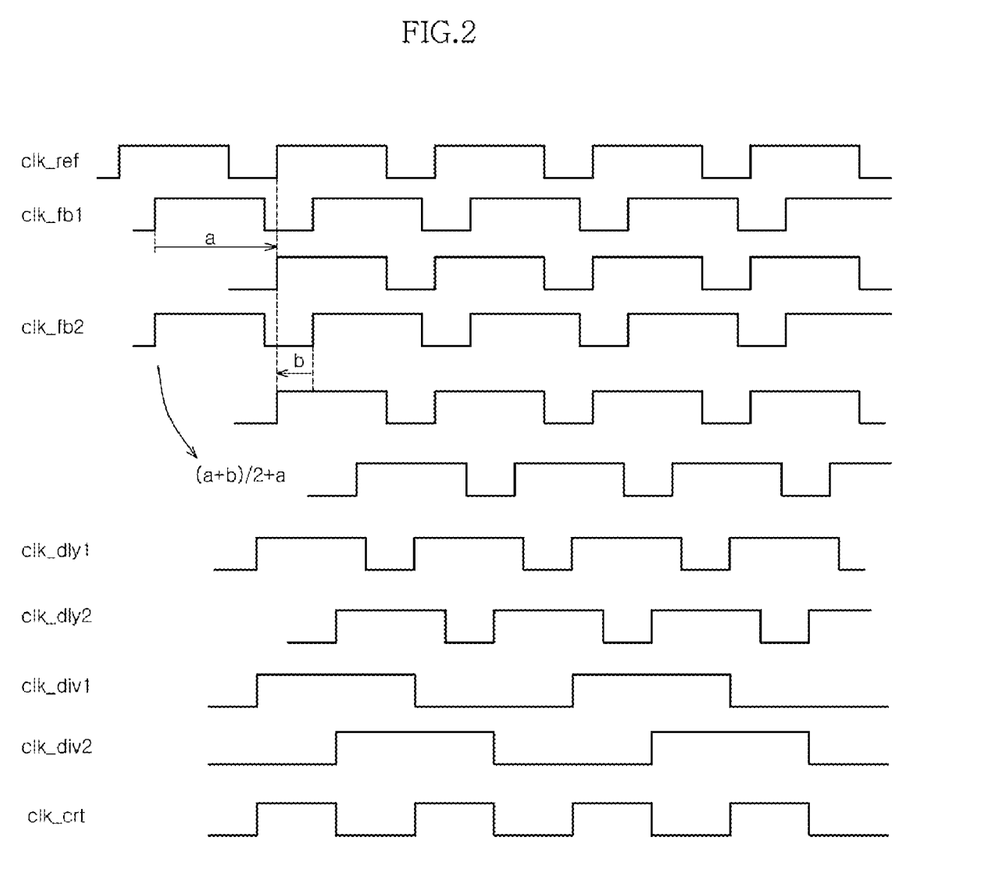
FIG. 2 is a timing chart illustrating the operation of the DLL circuit shown in FIG. 1.

When the delay time applied to the reference clock signal 'clk_ref' by the first delay line 110 is (a) and the delay time applied to the reference clock signal 'clk_ref' by the second delay line 210 is (b), then the cycle of the reference clock signal 'clk_ref' becomes (a+b), as can be seen in FIG. 2.

If the n bits of digital code representing the first delay amount information signal 'dlyinf1' conveys delay amount information of (a) and the n bits of digital code representing the second delay amount information signal 'dlyinf2' convey delay amount information of (b), then the half cycle detecting unit 250 can sum local values of the first delay amount information signal 'dlyinf1' and the second delay amount information signal 'dlyinf2', shift the summed logical value to a lower one bit at a time, and extract half cycle information of (a+b)/2. The half cycle detecting unit 250 can be configured to generate the half cycle information signal 'hfclinf' of n bits including the half cycle information and enable the delay initialization signal 'dlyini'.

Then, the second delay control unit 240 can be configured to initialize the generated second delay control signal 'dlycont2' in response to the delay initialization signal 'dlyini'. The second delay control unit 240 can further be configured to regenerate the second delay control signal 'dlycont2' having a logical value, which is obtained by summing logical values of the half cycle information signal 'hfclinf' and the first delay control signal 'dlycont1'. That is, the second delay line 210 can apply to the reference clock signal 'clk_ref' a delay amount of a+(a+b)/2, which is obtained by summing the delay amount (a+b)/2 indicated by the delay amount information included in the half cycle information signal 'hfclinf' and the delay amount (a) indicated by the delay amount information included in the first delay control signal 'dlycont1'.

As a result, the second delay clock signal 'clk_dly2' can have a phase that is more delayed than that of the first delay clock signal 'clk_dly1' by a half cycle of the reference clock signal 'clk_ref'.

The first clock dividing unit 310 can divide the frequency of the first delay clock signal 'clk_dly1' by two and generate the first division clock signal 'clk_div1'. Similar to the first clock dividing unit 310, the second clock dividing unit 320 can divide the frequency of the second delay clock signal 'clk_dly2' by two and generate the second division clock signal 'clk_div2'. In general, if a clock signal is divided using an edge-trigger-typed clock divider, then an output clock signal has a corrected duty ratio. Accordingly, each of the first division clock signal 'clk_div1' and the second division clock signal 'clk_div2' can have a division ratio of 50:50, and can have a phase difference that corresponds to the half cycle of the reference clock signal 'clk_ref'. Then, the clock combining unit 330 can combine the first division clock signal 'clk_div1' and the second division clock signal 'clk_div2' and generate the duty ratio correction clock signal 'clk_crt'.

Figure 3:
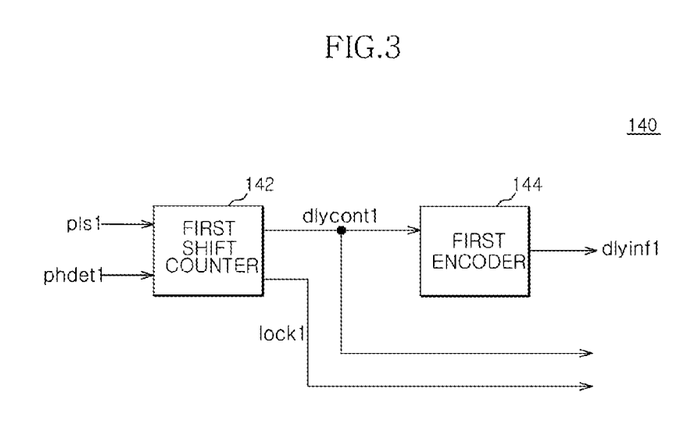
FIG. 3 is a diagram illustrating a detailed structure of a first delay control unit that can be included in the DLL circuit shown in FIG. 1.

Referring to FIG. 3, the first delay control unit 140 includes a first shift counter 142 and a first encoder 144.

The first shift counter 142 can be configured to generate the first delay control signal 'dlycont1' and the first locking signal 'lock1' in response to the first pulse signal 'pls1' and the first phase detection signal 'phdet1'. The first encoder 144 can be configured to receive the first delay control signal 'dlycont1' and to generate the first delay amount information signal 'dlyinf1'.

The first shift counter 142 can have the same structure as a delay control unit that is included in a conventional DLL circuit. That is, the first shift counter 142 initially sets a logical value of the first delay control signal 'dlycont1' including only one logical value of '1' among m bits as an arbitrary value, and shifts a bit having a logical value of '1' in response to the first phase detection signal 'phdet1'. The first shift counter 142 can change the delay amount of the first delay line 110 through the above-described operation. If information indicating that a phase difference between the reference clock signal 'clk_ref' and the first feedback clock signal 'clk_fb1' is decreased to be within a predetermined range is transmitted through the first phase detection signal 'phdet1', then the first shift counter 142 stops the shifting operation and enables the first locking signal 'lock1'.

The first encoder 144 can be configured to detect the number of digits by which a bit having a logical value of '1' included in the first delay control signal 'dlycont1' is moved, and to generate the first delay amount information signal 'dlyinf1' that corresponds to the detected result. That is, the first encoder 144 can be configured to set an initial logical value of the first delay control signal 'dlycont1' as a default value and to encode a changed logical value. As a result, the first encoder 144 can include delay amount information of the first delay line 110 in the first delay amount information signal 'dlyinf1'.

Figure 4:
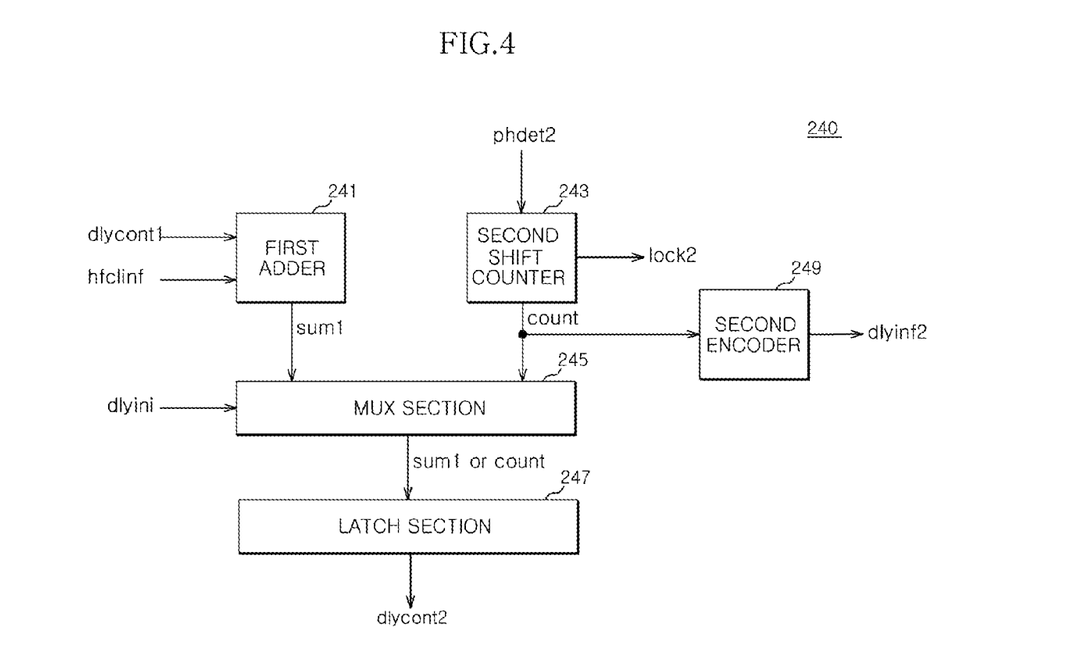
FIG. 4 is a diagram illustrating a detailed structure of a second delay control unit that can be included in the DLL circuit shown in FIG. 1.

Referring to FIG. 4, the second delay control unit 240 can include a first adder 241, a second shift counter 243, a MUX section 245, a latch section 247, and a second encoder 249.

The first adder 241 can be configured to sum the first delay control signal 'dlycont1' and the half cycle information signal 'hfclinf' and to generate a first summed signal 'sum1'. The second shift counter 243 can be configured to generate a count signal 'count' and the second locking signal 'lock2' in response to the second phase detection signal 'phdet2'. The MUX section 245 can selectively output the first summed signal 'sum1' or the count signal 'count' in response to the delay initialization signal 'dlyini'. The latch section 247 can latch each bit of an output signal from the MUX section 245 and output the signal as the second delay control signal 'dlycont2'. The second encoder 249 can receive the count signal 'count' and generate the second delay amount information signal 'dlyinf2'.

In this case, the operation of the second shift counter 243 and the second encoder 249 can be easily understood through the description of the first delay control unit 140.

It should also be noted that the delay initialization signal 'dlyini' can be implemented in a form of a pulse signal.

The MUX section 245 can be configured to transmit the count signal 'count' to the latch section 247, before the delay initialization signal 'dlyini' is enabled. In such a situation, the latch section 247 can latch each bit of the count signal 'count' and output the signal as the second delay control signal 'dlycont2'. Accordingly, the second delay control signal 'dlycont2' can transmit delay amount information, which is used to decrease a phase difference between the second feedback clock signal 'clk_fb2' and the reference clock signal 'clk_ref' transmitted through the second phase detection signal 'phdet2' to the second delay line 210.

Meanwhile, after the delay initialization signal 'dlyini' is enabled, the MUX section 245 can transmit the first summed signal 'sum1' to the latch section 247. In this case, the latch section 247 can latch each bit of the first summed signal 'sum1' and output the signal as the second delay control signal 'dlycont2'. At this time, the first summed signal 'sum1' can include information indicating a delay amount, which is obtained by summing a delay amount defined by the first delay control signal 'dlycont1' and a delay amount defined by the half cycle information signal 'hfclinf'. Accordingly, the second delay control signal 'dlycont2' can transmit the delay amount information included in the first summed signal 'sum1' to the second delay line 210.

Figure 5:
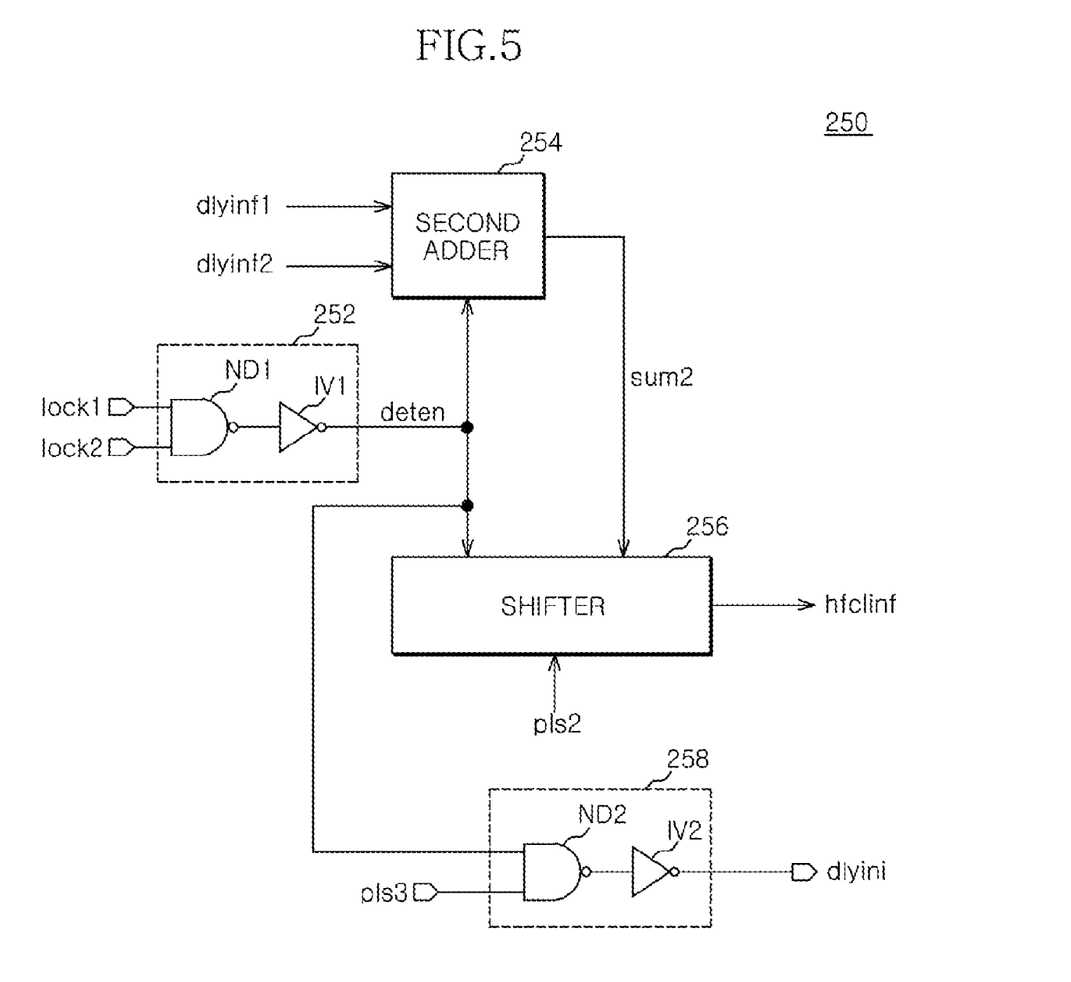
FIG. 5 is a diagram illustrating a detailed structure of a half cycle detecting unit that can be included in the DLL circuit shown in FIG. 1.

Referring to FIG. 5, the half cycle detecting unit 250 includes an enable section 252, a second adder 254, a shifter 256, and a delay initializing section 258.

The enable section 252 can be configured to receive the first locking signal 'lock1' and the second locking signal 'lock2' and to generate a detection enable signal 'deten'. The second adder 254 can sum logical values of the first delay amount information signal 'dlyinf1' and the second delay amount information signal 'dlyinf2' in response to the detection enable signal 'deten' and generate a second summed signal 'sum2'. The shifter 256 can shift a logical value of the second summed signal 'sum2' to a lower bit by one bit in response to the second pulse signal 'pls2' and the detection enable signal 'deten' and generate the half cycle information signal 'hfclinf'. The delay initializing section 258 can receive the third pulse signal 'pls3' and the detection enable signal 'deten' and generate the delay initialization signal 'dlyini'.

The enable section 252 can include a first NAND gate ND1 that can be configured to receive the first locking signal 'lock1' and the second locking signal 'lock2', and a first inverter IV1 that can be configured to receive an output signal of the first NAND gate ND1 and to output the detection enable signal 'deten'.

The delay initializing section 258 can include a second NAND gate ND2 that can be configured to receive the third pulse signal 'pls3' and the detection enable signal 'deten', and a second inverter IV2 that can be configured to receive an output signal of the second NAND gate ND2 and to output the delay initialization signal 'dlyini'.

In the above-described structure, when both the first locking signal 'lock1' and the second locking signal 'lock2' are enabled, the detection enable signal 'deten' is enabled. Thus, the second adder 254 can start the operation and the second summed signal 'sum2' can be generated. Then, when the second pulse signal 'pls2' is enabled, the shifter 256 can shift each bit of the second summed signal 'sum2' by one bit. Therefore, the half cycle information signal 'hfclinf' can include half cycle information of the reference clock signal 'clk_ref' in encoded as a logical value. Then, when the third pulse signal 'pls3' is enabled, the delay initialization signal 'dlyini' can be enabled.

Figure 6:
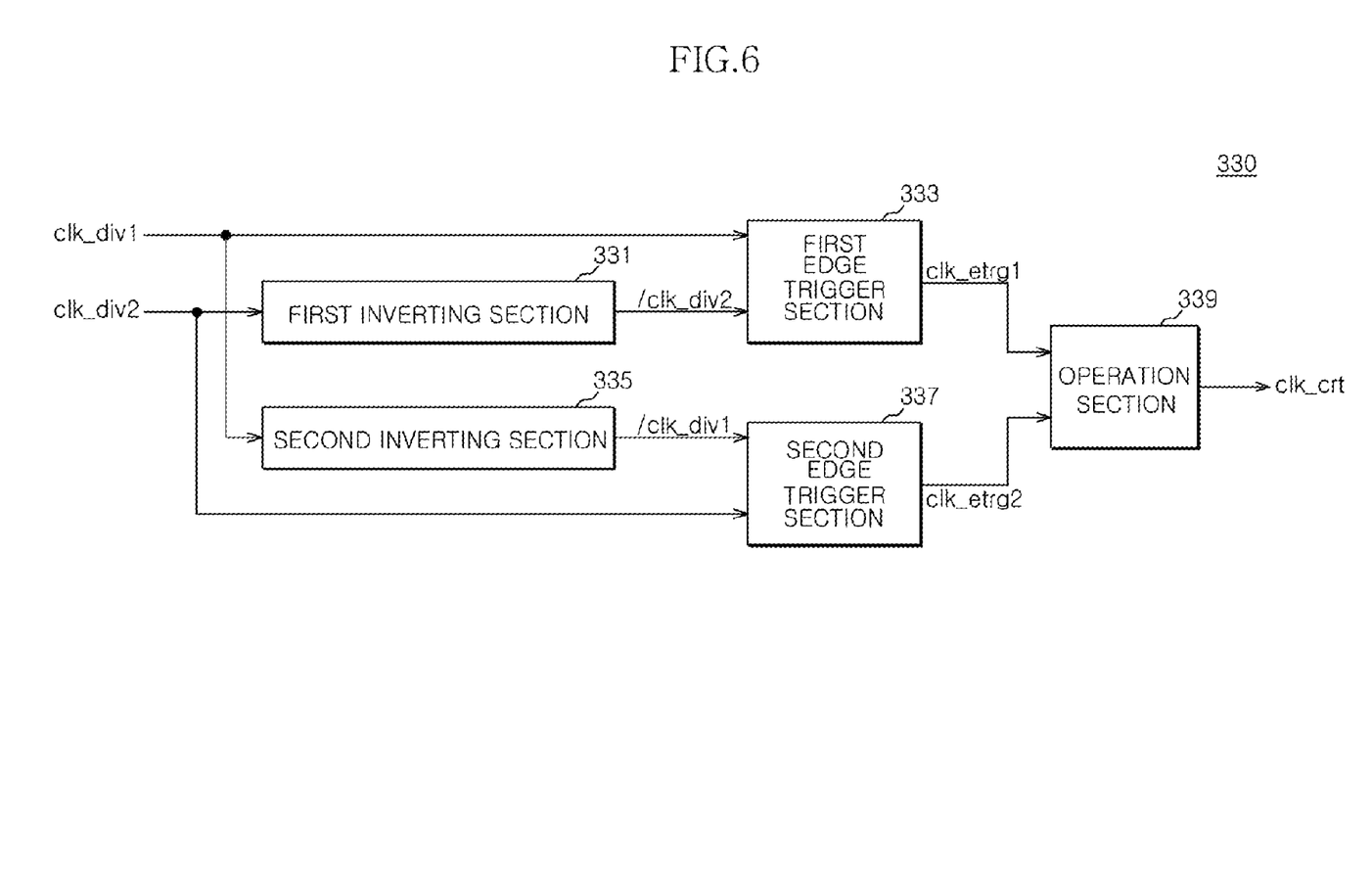
FIG. 6 is a diagram illustrating a detailed structure of a clock combining unit that can be included in the DLL circuit shown in FIG. 1.

Referring to FIG. 6, the clock combining unit 330 can include a first inverting section 331, a first edge trigger section 333, a second inverting section 335, a second edge trigger section 337, and an operation section 339.

The first inverting section 331 can be configured to invert the second division clock signal 'clk_div2' and to generate a negative second division clock signal '/clk_div2'. The first edge trigger section 333 can receive the first division clock signal 'clk_div1' and the negative second division clock signal '/clk_div2', latch the clock signals at rising times thereof, and generate a first edge triggering clock signal 'clk_etrg1'.

The second inverting section 335 can be configured to invert the first division clock signal 'clk_div1' and to generate a negative first division clock signal /'clk_div1'. The second edge trigger section 337 receive the negative first division clock signal '/clk_div1' and the second division clock signal 'clk_div2', latch the clock signals at rising edge timing thereof, and generate a second edge triggering clock signal 'clk_etrg2'. The operation section 339 performs an AND operation on the first edge triggering clock signal 'clk_etrg1' and the second edge triggering clock signal 'clk_etrg2' and outputs the duty ratio correction clock signal 'clk_crt'.

Figure 7A:
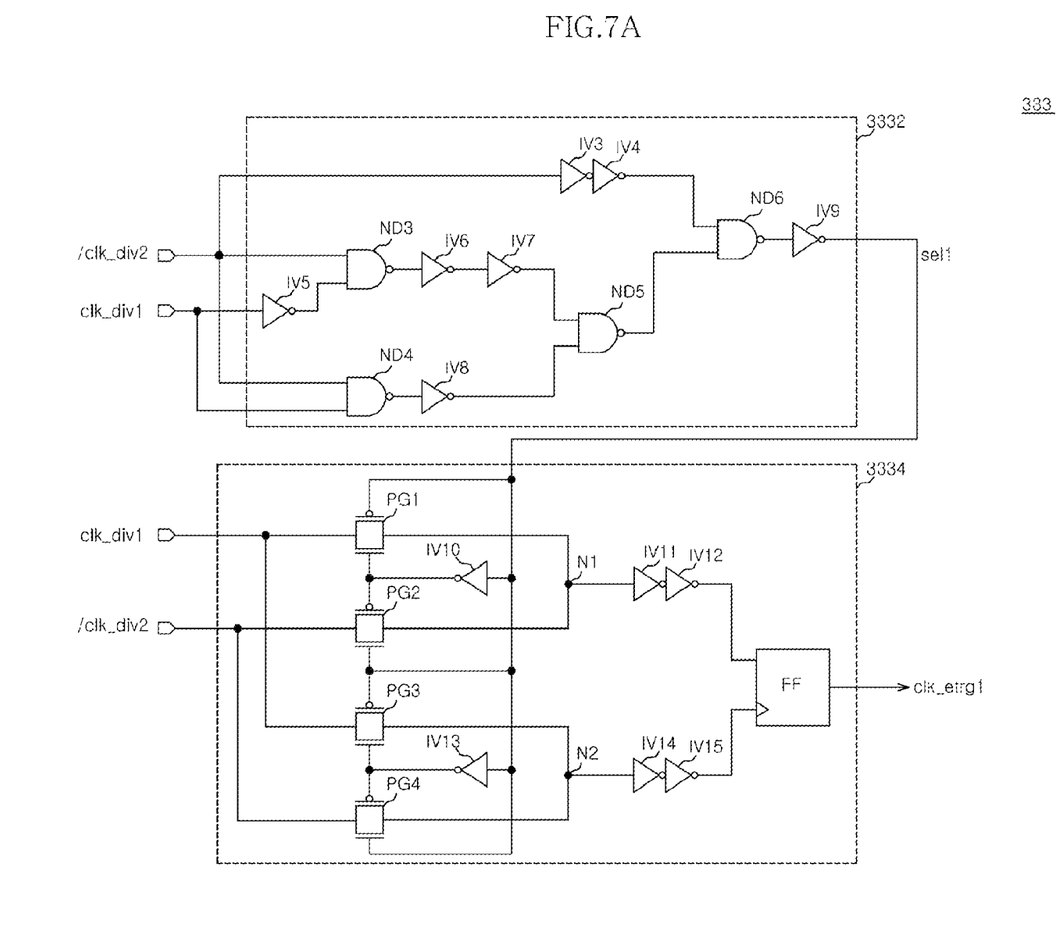
FIG. 7A is a diagram illustrating a detailed structure of a first edge trigger section that can be included in the clock combining unit shown in FIG. 6.

Referring to FIG. 7A, the first edge trigger section 333 can include a first selecting section 3332 and a first triggering section 3334.

The first selecting section 3332 can be configured to generate a first selection signal 'sel1' in response to the first division clock signal 'clk_div1' and the negative second division clock signal '/clk_div2'. The first triggering section 3334 can latch the negative second division clock signal '/clk_div2' at a rising edge timing of the first division clock signal 'clk_div1' or latch the first division clock signal 'clk_div1' at a rising edge timing of the negative second division clock signal '/clk_div2', in response to the first selection signal 'sel1', and generate the first edge triggering clock signal 'clk_etrg1'.

The first selecting section 3332 can include third to ninth inverters IV3 to IV9 and third to sixth NAND gates ND3 to ND6.

The third inverter IV3 can receive the negative second division clock signal '/clk_div2'. The fourth inverter IV4 can receive an output signal of the third inverter IV3. The fifth inverter IV5 can receive the first division clock signal 'clk_div1'. The third NAND gate ND3 can receive the negative second division clock signal '/clk_div2' and an output signal of the fifth inverter IV5. The sixth inverter IV6 can receive an output signal of the third NAND gate ND3. The seventh inverter IV7 can receive an output signal of the sixth inverter IV6. The fourth NAND gate ND4 can receive the first division clock signal 'clk_div1' and the negative second division clock signal /'clk_div2'. The eighth inverter IV8 can receive an output signal of the fourth NAND gate ND4. The fifth NAND gate ND5 can receive an output signal of the seventh inverter IV7 and an output signal of the eighth inverter IV8. The sixth NAND gate ND6 can receive an output signal of the fourth inverter IV4 and an output signal of the fifth NAND gate ND5. The ninth inverter IV9 can receive an output signal of the sixth NAND gate ND6 and output the first selection signal 'sel1'.

The first triggering section 3334 can include tenth to fifteenth inverters IV10 to IV15, first to fourth pass gates PG1 to PG4, and a flip-flop FF.

The tenth inverter IV10 can receive the first selection signal 'sel1'. The first pass gate PG1 can transmit the first division clock signal 'clk_div1' to a first node N1 in response to the first selection signal 'sel1' and an output signal of the tenth inverter IV10. The second pass gate PG2 can transmit the negative second division clock signal '/clk_div2' to the first node N1 in response to the first selection signal 'sel1' and an output signal of the tenth inverter IV10. The eleventh inverter IV11 can receive a signal transmitted to the first node N1. The twelfth inverter IV12 can receive an output signal of the eleventh inverter IV11. The thirteenth inverter IV13 can receive the first selection signal 'sel1'. The third pass gate PG3 can transmit the negative second division clock signal '/clk_div2' to a second node N2 in response to the first selection signal 'sel1' and an output signal of the thirteenth inverter IV13. The fourth pass gate PG4 can transmit the first division clock signal 'clk_div1' to the second node N2 in response to the first selection signal 'sel1' and an output signal of the thirteenth inverter IV13. The fourteenth inverter IV14 can receive a signal transmitted to the second node N2. The fifteenth inverter IV15 can receive an output signal of the fourteenth inverter IV14. The flip-flop FF can latch an output signal of the twelfth inverter IV12 per rising edge timing of an output signal of the fifteenth inverter IV15 and output the first edge triggering clock signal 'clk_etrg1'.

Figure 7B:
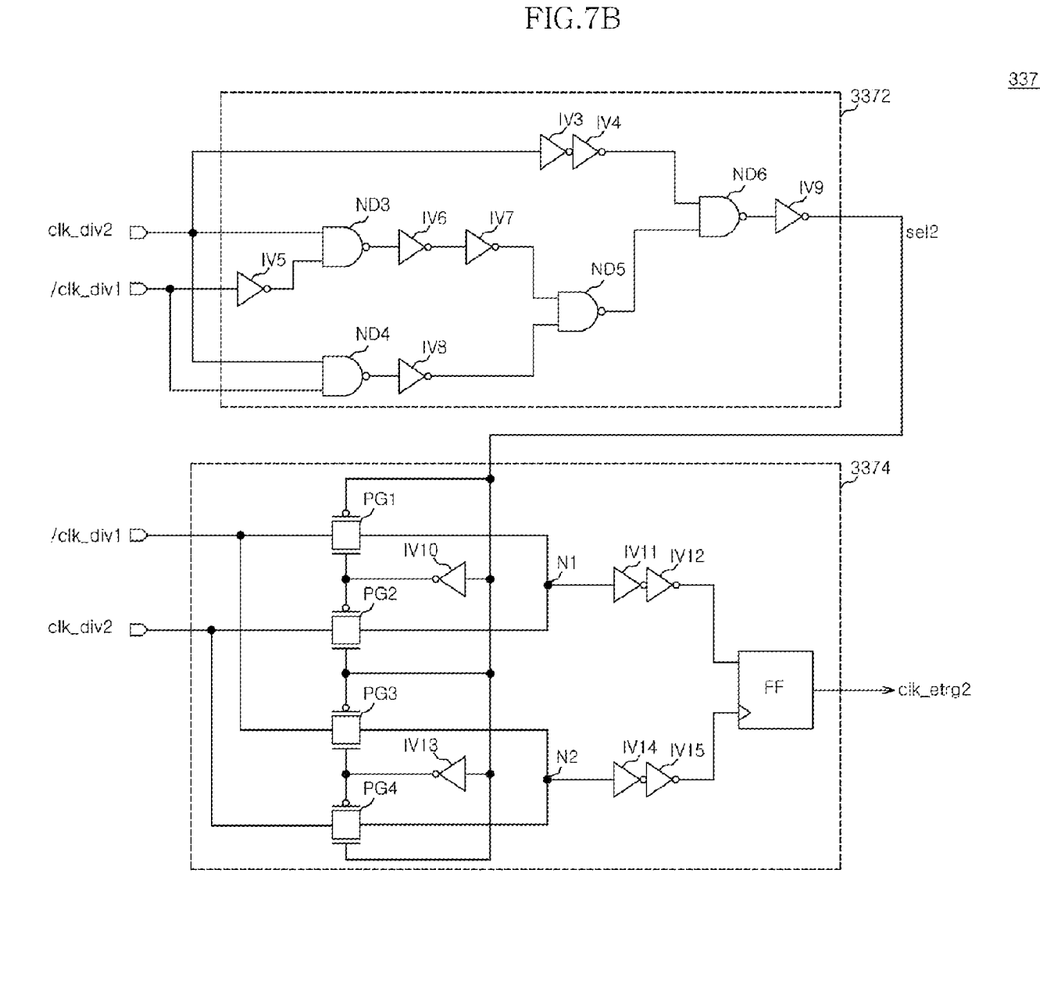
FIG. 7B is a diagram illustrating a detailed structure of a second edge trigger section that can be included in the clock combining unit shown in FIG. 6.

The second edge trigger section 337 shown in FIG. 7B can have the same structure as the first edge trigger section 333 except that the negative first division clock signal '/clk_div1' is used instead of the first division clock signal 'clk_div1' and the second division clock signal 'clk_div2' is used instead of the negative second division clock signal '/clk_div2'.

The second edge trigger section 337 can include a second selecting section 3372 and a second triggering section 3374.

The second selecting section 3372 can be configured to generate a second selection signal 'sel2' in response to the negative first division clock signal '/clk_div1' and the second division clock signal 'clk_div2'. In response to the second selection signal 'sel2', the second triggering section 3374 can latch the second division clock signal 'clk_div2' at a rising edge timing of the negative first division clock signal '/clk_div1' or the negative first division clock signal '/clk_div1' at a rising edge timing of the second division clock signal 'clk_div2', and generate the second edge triggering clock signal 'clk_etrg2'.

The components of the second selecting section 3372 and the second triggering section 3374 are denoted by the same reference numerals as the components of the first selecting section 3332 and the first triggering section 3334 in the first edge trigger section 333.

The operation of the clock combining unit 330 that has the above-described structure will now be described in detail with reference to the timing chart shown in FIG. 8.

In the first edge trigger section 333, when the negative second division clock signal '/clk_div2' is at a high level and the first division clock signal 'clk_div1' is at a low level, then an output signal of the fifth NAND gate ND5 of the first selecting section 3332 transitions to a high level. At this time, since the output signal of the fourth inverter IV4 is also at a high level, the level of the first selection signal 'sel1' transitions to a high level. Therefore, the second pass gate PG2 and the fourth pass gate PG4 of the first triggering section 3334 are turned on. If the level of the first division clock signal 'clk_div1' transitions to a high level, then the flip-flop FF latches the negative second division clock signal '/clk_div2' and generates the first edge triggering clock signal 'clk_etrg1' at a high level.

As the level of the first division clock signal 'clk_div1' transitions to a high level, the output signal of the fifth NAND gate ND5 becomes a low level, and the first selection signal 'sel1' also transitions to a low level.

Accordingly, the first pass gate PG1 and the third pass gate PG3 are turned on, and the second pass gate PG2 and the fourth pass gate PG4 are turned off. The flip-flop FF latches the first division clock signal 'clk_div1' at a rising edge timing of the negative second division clock signal '/clk_div2'. However, at this time, since the negative second division clock signal '/clk_div2' is at a high level, the flip-flop FF continuously outputs the latched first edge triggering clock signal 'clk_etrg1'.

Even if the level of the negative second division clock signal '/clk_div2' is changed to a low level, the first selection signal 'sel1' is maintained at a low level, and thus the operation of the flip-flop FF does not change. However, at the rising edge timing of the negative second division clock signal '/clk_div2', the flip-flop FF latches the first division clock signal 'clk_div1' and outputs the first edge triggering clock signal 'clk_etrg1' at a low level. The level of the first selection signal 'sel1' then becomes a high level again.

Figure 8:
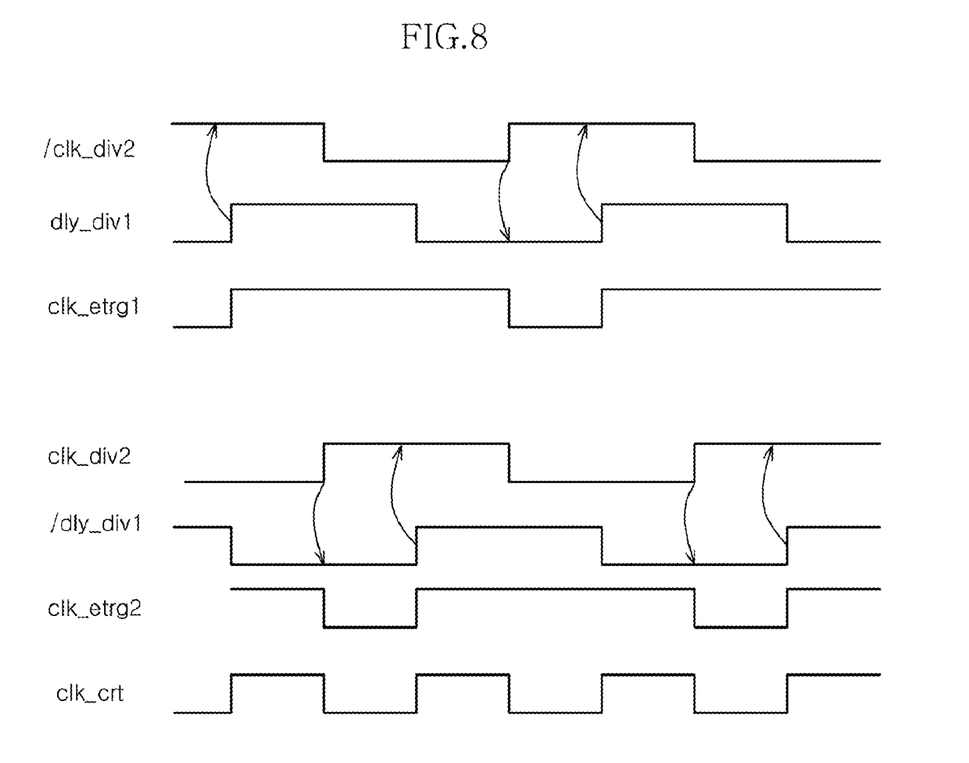
FIG. 8 is a timing chart illustrating the operation of the clock combining unit shown in FIGS. 6, 7A, and 7B.

The first edge trigger section 333 repeats the above-described operation, and generates the first edge triggering clock signal 'clk_etrg1', as shown in FIG. 8. That is, the first edge triggering clock signal 'clk_etrg1' has a waveform of a form in which the first division clock signal 'clk_div1' and the negative second division clock signal '/clk_div2' are latched to each other at rising edge timings thereof.

The second edge trigger section 337 has the same structure as the first edge trigger section 333 except for input signals. Accordingly, the second edge triggering clock signal 'clk_etrg2' has a waveform of a form in which the negative first division clock signal '/clk_div1' and the second division clock signal 'clk_div2' are latched to each other at rising edge timings thereof, as shown in FIG. 8.

The operation section 339 performs an AND operation on the first edge triggering clock signal 'clk_etrg1' and the second edge triggering clock signal 'clk_etrg2' and generates the duty ratio correction clock signal 'clk_crt'. Although not shown in detail in the drawing, the operation section 339 may include a NAND gate and an inverter and be easily implemented.

That is, the clock combining unit 330 inverts the first division clock signal 'clk_div1' to generate the negative first division clock signal '/clk_div1', and the second division clock signal 'clk_div2' to generate the negative second division clock signal '/clk_div2'. Then, the clock combining unit 330 latches the first division clock signal 'clk_div1' and the negative second division clock signal '/clk_div2' at rising edge timing thereof to generate the first edge triggering clock signal 'clk_etrg1'. The clock combining unit 330 latches the negative first division clock signal '/clk_div1' and the second division clock signal 'clk_div2' at rising edge timing thereof to generate the second edge triggering clock signal 'clk_etrg2'. Then, the clock combining unit 330 performs an AND operation on the first edge triggering clock signal 'clk_etrg1' and the second edge triggering clock signal 'clk_etrg2', thereby generating the duty ratio correction clock signal 'clk_crt' whose duty ratio has been corrected.

As described above, the DLL circuit according to the embodiments described herein has a dual loop type. The DLL circuit primarily controls the delay amount of the first delay line in response to the first phase detection signal and controls the delay amount of the second delay line in response to the second phase detection signal. Then, the DLL circuit extracts half period information of the reference clock signal on the basis of the delay amount applied to the first delay line and the delay amount applied to the second delay line, and initializes the delay operation by the second delay line.

Such a DLL circuit applies the delay amount, which is obtained by summing the delay amount corresponding to a half cycle of the reference clock signal and the delay amount applied to the first delay line, to the second delay line, such that a phase of an output clock signal from the first delay line becomes different from a phase of an output clock signal from the second delay line by the half cycle. Then, if each of frequencies of the output clock signal from the first delay line and the output clock signal from the second delay line is divided with a predetermined division ratio and the divided clock signals are combined, it is possible to obtain a clock signal whose duty ratio has been corrected.

In the embodiments described herein, the DLL circuit does not include a separate duty cycle correction circuit and can generate a clock signal having an improved duty ratio characteristic without greatly increasing an occupied area. Since the duty ratio characteristic of the output clock signal can be efficiently improved, it is possible to stably support the operation of the semiconductor integrated circuit.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A delay locked loop (DLL) circuit of a dual loop type, comprising:
    a first delay control unit configured to generate a first delay control signal in response to a first phase detection signal to control a delay amount of a first delay line and to output a first delay amount information signal;
    a second delay control unit configured to generate a second delay control signal in response to a second phase detection signal to control a delay amount of a second delay line and to output a second delay amount information signal, and to control the delay amount of the second delay line again in response to the first delay control signal and a half cycle information signal;
    a half cycle detecting unit coupled with the first delay control unit and the second delay control unit, the half cycle detecting unit configured to receive the first delay amount information signal and the second delay amount information signal to extract half cycle information of a reference clock signal, thereby generating the half cycle information signal; and
    a duty cycle correcting unit configured to combine an output clock signal from the first delay line and an output clock signal from the second delay line, thereby outputting a duty ratio correction clock signal.

2. The DLL circuit of claim 1, wherein the first delay control signal is implemented as a plurality of bits of digital codes, and wherein the first delay control unit is further configured to change logical values of the digital codes of the first delay control signal in response to the first phase detection signal, and to output the first delay amount information signal that includes information indicating variations in the logical values.

3. The DLL circuit of claim 2, wherein the first delay control unit comprises:
    a first shift counter configured to generate the first delay control signal and a first locking signal in response to a first pulse signal generated from a clock generator and the first phase detection signal; and
    a first encoder configured to receive the first delay control signal and to generate the first delay amount information signal.

4. The DLL circuit of claim 3, wherein each of the second delay control signal and the half cycle information signal is implemented as a plurality of bits of digital codes, and wherein the second delay control unit is configured to change logical values of the digital codes of the second delay control signal in response to the second phase detection signal, and to output the second delay amount information signal that includes information indicating variations in the logical values.

5. The DLL circuit of claim 4, wherein the second delay control unit is configured to initialize the second delay control signal in response to a delay initialization signal and to regenerate the second delay control signal having a logical value, which is obtained by summing logical values of the half cycle information signal and the first delay control signal.

6. The DLL circuit of claim 5, wherein the second delay control unit comprises:
a first adder configured to sum the first delay control signal and the half cycle information signal, thereby generating a first summed signal;
a second shift counter configured to generate a count signal and a second locking signal in response to the second phase detection signal;
a MUX section configured to selectively output the first summed signal or the count signal in response to the delay initialization signal;
a latch section configured to latch each bit of a signal output from the MUX section and to output the latched signal as the second delay control signal; and
a second encoder configured to receive the count signal, thereby generating the second delay amount information signal.

7. The DLL circuit of claim 6, wherein the half cycle detecting unit is configured to sum logical values of the first delay amount information signal and the second delay amount information signal, to shift each bit thereof to a lower bit by one bit to generate the half cycle information signal, and to enable the delay initialization signal when the half cycle information signal is generated.

8. The DLL circuit of claim 7, wherein the half cycle detecting unit comprises:
an enable section configured to receive the first locking signal and the second locking signal, thereby generating a detection enable signal;
a second adder configured to sum the first delay amount information signal and the second delay amount information signal in response to the detection enable signal, thereby generating a second summed signal;
a shifter configured to shift each logical value of the second summed signal to a lower bit by one bit in response to a second pulse signal output from the clock generator and the detection enable signal, thereby generating the half cycle information signal; and
a delay initializing section configured to receive a third pulse signal output from the clock generator and the detection enable signal, thereby generating the delay initialization signal.

9. The DLL circuit of claim 1, wherein the duty cycle correcting unit comprises:
a first clock dividing unit configured to divide an output clock signal from the first delay line with a predetermined division ratio, thereby generating a first division clock signal;
a second clock dividing unit configured to divide an output clock signal from the second delay line with the predetermined division ratio, thereby generating a second division clock signal; and
a clock combining unit configured to combine the first division clock signal and the second division clock signal, thereby generating the duty ratio correction clock signal.

10. The DLL circuit of claim 9, wherein the clock combining unit comprises:
a first inverting section configured to invert the second division clock signal, thereby generating a negative second division clock signal;

a first edge trigger section configured to receive the first division clock signal and the negative second division clock signal, and to latch the clock signals at rising edge timings thereof, thereby generating a first edge triggering clock signal;
a second inverting section configured to invert the first division clock signal, thereby generating a negative first division clock signal;
a second edge trigger section configured to receive the negative first division clock signal and the second division clock signal, and to latch the clock signals at rising edge timing thereof, thereby generating a second edge triggering clock signal; and
an operation section configured to perform an AND operation on the first edge triggering clock signal and the second edge triggering clock signal, thereby generating the duty ratio correction clock signal.

11. The DLL circuit of claim 10, wherein the first edge trigger section comprises:
a selecting section configured to generate a selection signal in response to the first division clock signal and the negative second division clock signal; and
a triggering section configured, in response to the selection signal, to latch the negative second division clock signal at a rising edge timing of the first division clock signal or the first division clock signal at a rising edge timing of the negative second division clock signal, thereby generating the first edge triggering clock signal.

12. The DLL circuit of claim 10, wherein the second edge trigger section comprises:
a selecting section configured to generate a selection signal in response to the negative first division clock signal and the second division clock signal; and
a triggering section configured, in response to the selection signal, to latch the second division clock signal at a rising edge timing of the negative first division clock signal or the negative first division clock signal at a rising edge timing of the second division clock signal, thereby generating the second edge triggering clock signal.

13. The DLL circuit of claim 1, further comprising:
a first delay compensating unit configured to apply a delay time obtained by simulating a delay amount of delay elements on an output path of a clock signal output from the first delay line, thereby generating a first feedback clock signal;
a first phase detecting unit configured to detect and compare phases of the reference clock signal and the first feedback clock signal, thereby generating the first phase detection signal;
a second delay compensating unit configured to apply a delay time obtained by simulating a delay amount of delay elements on an output path of a clock signal output from the second delay line, thereby generating a second feedback clock signal; and
a second phase detecting unit configured to detect and compare phases of the reference clock signal and the second feedback clock signal, thereby generating the second phase detection signal.

14. A delay locked loop (DLL) circuit of a dual loop type, comprising:
a delay control unit configured to generate a first delay control signal in response to a first phase detection signal and to generate a second delay control signal that defines a delay amount, which is obtained by summing a delay amount defined by the first delay control signal and a delay amount corresponding to a half cycle of a reference clock signal;

a first delay line configured to delay the reference clock signal in response to the first delay control signal, thereby generating a first delay clock signal;

a second delay line configured to delay the reference clock signal in response to the second delay control signal, thereby generating a second delay clock signal; and a duty cycle correcting unit configured to combine the first delay clock signal and the second delay clock signal, thereby generating a duty ratio correction clock signal.

15. The DLL circuit of claim 14, wherein the delay control unit comprises:

a first delay control unit configured to generate the first delay control signal and a first delay amount information signal in response to the first phase detection signal;

a second delay control unit configured to generate the second delay control signal and a second delay amount information signal in response to a second phase detection signal and to regenerate the second delay control signal in response to the first delay control signal and a half cycle information signal; and a half cycle detecting unit configured to receive the first delay amount information signal and the second delay amount information signal to extract half cycle information of the reference clock signal therefrom, thereby generating the half cycle information signal.

16. The DLL circuit of claim 15, wherein the first delay control signal is implemented as a plurality of bits of digital codes, and wherein the first delay control unit is configured to change logical values of the digital codes of the first delay control signal in response to the first phase detection signal, and to output the first delay amount information signal that includes information indicating variations in the logical values.

17. The DLL circuit of claim 15, wherein each of the second delay control signal and the half cycle information signal is implemented as a plurality of bits of digital codes, and wherein the second delay control unit is configured to change logical values of the digital codes of the second delay control signal in response to the second phase detection signal, and to output the second delay amount information signal that includes information indicating variations in the logical values.

18. The DLL circuit of claim 17, wherein the second delay control unit is configured to initialize the second delay control signal in response to a delay initialization signal and to regenerate the second delay control signal having a logical value, which is obtained by summing logical values of the half cycle information signal and the first delay control signal.

19. The DLL circuit of claim 17, wherein the half cycle detecting unit is configured to sum logical values of the first delay amount information signal and the second delay amount information signal, to shift each bit thereof to a lower bit by one bit to generate the half cycle information signal, and to enable the delay initialization signal when the half cycle information signal is generated.

20. The DLL circuit of claim 14, wherein the duty cycle correcting unit comprises:

a first clock signal dividing unit configured to divide the first delay clock signal with a predetermined division ratio, thereby generating a first division clock signal;

a second clock signal dividing unit configured to divide the second delay clock signal with the predetermined division ratio, thereby generating a second division clock signal; and a clock combining unit configured to combine the first division clock signal and the second division clock signal, thereby generating the duty ratio correction clock signal.

21. The DLL circuit of claim 20, wherein the clock combining unit includes:

a first inverting section configured to invert the second division clock signal, thereby generating a negative second division clock signal;

a first edge trigger section configured to receive the first division clock signal and the negative second division clock signal, and to latch the clock signals at rising edge timings thereof, thereby generating a first edge triggering clock signal;

a second inverting section configured to invert the first division clock signal, thereby generating a negative first division clock signal;

a second edge trigger section configured to receive the negative first division clock signal and the second division clock signal, and to latch the clock signals at rising edge timings thereof, thereby generating a second edge triggering clock signal; and an operation section configured to perform an AND operation on the first edge triggering clock signal and the second edge triggering clock signal, thereby generating the duty ratio correction clock signal.

22. The DLL circuit of claim 15, further comprising:

a first delay compensating unit configured to apply a delay time obtained by simulating a delay amount of delay elements on an output path of the first delay clock signal to the first delay clock signal, thereby generating a first feedback clock signal;

a first phase detecting unit configured to detect and compare phases of the reference clock signal and the first feedback clock signal, thereby generating the first phase detection signal;

a second delay compensating unit configured to apply a delay time obtained by simulating a delay amount of delay elements on an output path of the second delay clock signal to the second delay clock signal, thereby generating a second feedback clock signal; and a second phase detecting unit configured to detect and compare phases of the reference clock signal and the second feedback clock signal, thereby generating the second phase detection signal.

23. A delay locked loop (DLL) circuit comprising:

a first feedback loop configured to delay a reference clock signal by a first delay amount to generate a first delay clock signal;

a second feedback loop configured to delay the reference clock signal by a second delay amount to generate a second delay clock signal, and to delay the reference clock signal in response to delay amount information for the first delay clock signal and a half cycle information signal, thereby regenerating the second delay clock signal;

a half cycle detecting unit configured to use information for the first delay amount and information for the second delay amount to extract half cycle information of the reference clock signal, thereby generating the half cycle information signal; and a duty cycle correcting unit configured to combine the first delay clock signal and the second delay clock signal, thereby generating a duty ratio correction clock signal.

24. A method of controlling a delay locked loop (DLL) circuit of a dual loop type, the method comprising:

controlling delay amounts of a first delay line and a second delay line in response to a first phase detection signal and a second phase detection signal;

extracting half cycle information of a reference clock signal on the basis of delay amount information of the first delay line and delay amount information of the second delay line;

controlling the delay amount of the second delay line again in response to the half cycle information and the delay amount information of the first delay line; and combining a clock signal output from the first delay line and a clock signal output from the second delay line, thereby generating a duty ratio correction clock signal.

25. The method of claim 24, wherein, the controlling of the delay amounts of the first delay line and the second delay line is generating a plurality bits of a first delay control signal in response to the first phase detection signal and controlling the delay amount of the first delay line, and generating a plurality bits of a second delay control signal in response to the second phase detection signal and controlling the delay amount of the second delay line, the controlling of the delay amounts of the first delay line and the second delay line is outputting information indicating variations in logical values of the first delay control signal after changing the logical values of the first delay control signal as the delay amount information of the first delay line, and outputting information indicating variations in logical values of the second delay control signal after changing the logical values of the second delay control signal as the delay amount information of the second delay line.

26. The method of claim 24, wherein, the extracting of the half cycle information of the reference clock signal, is summing a logical value of a signal transmitting the delay amount information of the first delay line and a logical value of a signal transmitting the delay amount information of the second delay line, and then shifting each bit to a lower bit by one bit of the summed logical values, and extracting the half cycle information of the reference clock signal.

27. The method of claim 25, wherein the controlling of the delay amount of the second delay line again is generating the second delay control signal having a logical value that is obtained by summing the delay amount defined by the first delay control signal and the delay amount corresponding to the half cycle of the reference clock signal, after initializing the second delay control signal.

28. The method of claim 24, wherein the generating of the duty ratio correction clock signal comprises:

dividing an output clock signal from the first delay line with a predetermined division ratio, thereby generating a first division clock signal;

dividing an output clock signal from the second delay line with the predetermined division ratio, thereby generating a second division clock signal;

inverting the first division clock signal and the second division clock signal, thereby generating a negative first division clock signal and a negative second division clock signal;

latching the first division clock signal and the negative second division clock signal at rising edge timings thereof to generate a first edge triggering clock signal, and latching the negative first division clock signal and the second division clock signal at rising edge timings thereof to generate a second edge triggering clock signal; and performing an AND operation on the first edge triggering clock signal and the second edge triggering clock signal, thereby generating the duty ratio correction clock signal.

* * * * *